(12) United States Patent
Jung

(10) Patent No.: US 7,199,478 B2
(45) Date of Patent: Apr. 3, 2007

(54) PRINTED CIRCUIT BOARD HAVING AN IMPROVED LAND STRUCTURE

(75) Inventor: Sung-ho Jung, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 674 days.

(21) Appl. No.: 10/156,016

(22) Filed: May 29, 2002

(65) Prior Publication Data

US 2003/0011074 A1 Jan. 16, 2003

(30) Foreign Application Priority Data

Jul. 11, 2001 (KR) .......................................... 2001-41547

(51) Int. Cl.
 *H01L 23/48* (2006.01)
 *H01L 23/52* (2006.01)
 *H01L 29/40* (2006.01)
 *H05K 7/10* (2006.01)
 *H05K 7/12* (2006.01)

(52) U.S. Cl. ...................... 257/786; 174/250; 361/767; 257/E23.02

(58) Field of Classification Search ................. 257/778, 257/786, 678, 773, 799, 781; 438/612, 613
 See application file for complete search history.

(56) References Cited

U.S. PATENT DOCUMENTS

| | | | | |
|---|---|---|---|---|
| 4,720,915 A | * | 1/1988 | Kennedy et al. ............... 29/847 |
| 5,194,137 A | * | 3/1993 | Moore et al. ................ 205/125 |
| 5,300,815 A | * | 4/1994 | Rostoker ...................... 257/786 |
| 5,593,927 A | * | 1/1997 | Farnworth et al. ........... 438/113 |
| 5,829,124 A | * | 11/1998 | Kresge et al. ................. 29/840 |
| 6,118,182 A | | 9/2000 | Barrow |
| 6,218,630 B1 | * | 4/2001 | Takigami ..................... 174/261 |
| 6,232,668 B1 | * | 5/2001 | Hikita et al. ................. 257/777 |
| 6,316,736 B1 | * | 11/2001 | Jairazbhoy et al. ......... 174/260 |
| 6,342,682 B1 | * | 1/2002 | Mori et al. .................. 174/262 |
| 2002/0030288 A1 | * | 3/2002 | Hashimoto ................... 257/784 |
| 2002/0125043 A1 | * | 9/2002 | Yoshida ....................... 174/261 |
| 2002/0144397 A1 | * | 10/2002 | Morris ......................... 29/848 |

FOREIGN PATENT DOCUMENTS

| | | | |
|---|---|---|---|
| JP | 04-241676 | * | 8/1992 |
| JP | 1999-006103 | | 2/1999 |
| JP | 2000-77819 | * | 3/2000 |
| JP | 2000-208909 | | 7/2000 |
| JP | 2000-244106 | | 9/2000 |
| JP | 2001-320154 | * | 11/2001 |

OTHER PUBLICATIONS

English Language Chinese Office Action for Chinese Patent Application No. 02122290.8, dated Feb. 27, 2004, (related to present application).

* cited by examiner

*Primary Examiner*—David A. Zarneke
(74) *Attorney, Agent, or Firm*—Staas & Halsey LLP

(57) ABSTRACT

A printed circuit board (PCB) having a plurality of lands corresponding to a plurality of solder pins provided on a semiconductor chip package, the lands provided adjacent to the border of the printed circuit board having a rectangular shape elongated in a direction toward the border, thus providing a printed circuit board which can achieve a simple design, improve the integration of peripheral chips mounted thereon, and secure a fine soldering state.

12 Claims, 3 Drawing Sheets

PRINTED CIRCUIT BOARD HAVING AN IMPROVED LAND STRUCTURE

CROSS-REFERENCE TO RELATED APPLICATIONS

This application claims the benefit of Korean Patent Application No. 2001-41547 filed on Jul. 11, 2001, in the Korean Industrial Property Office, the disclosure of which is incorporated herein by reference.

BACKGROUND OF THE INVENTION

1. Field of the Invention

The present invention relates in general to a printed circuit board (PCB), and more particularly, to a printed circuit board which is improved in the structure of lands to be connected to solder balls of a semiconductor chip package.

2. Description of the Related Art

Generally, a semiconductor chip package is classified into a dual in-line package (DIP or IMT) type package and a surface mount technology (SMT) type package. Recently, compared with the IMT package, the SMT package has been widely used to enhance the mounting efficiency of the package to a PCB in line with a miniaturization of electronic appliances. As examples of the SMT package, there is the QFP (quad flat package), the PLCC (plastic leaded chip carrier), the CLCC (ceramic leaded chip carrier), the BGA (ball grid array), etc.

As illustrated in FIG. 1, a BGA package 5, as an example of an SMT package is comprised of a substrate 7 made of a ceramic or epoxy, a circuit pattern 8 formed on the substrate 7, a solder mask 9 coated on the circuit pattern 8, a semiconductor chip 3 mounted on the center of the substrate 7, and a wire 4 electrically connecting the circuit pattern 8 with the semiconductor chip 3. The semiconductor chip 3 and the wire 4 are covered with a resin cover 6 to prevent oxidation and corrosion. On a lower surface of the substrate 7 facing a printed circuit board 1 is provided a plurality of solder balls 10 which are electrically connected to the substrate 7. The BGA package 5 is mounted on the printed circuit board 1 by the solder balls 10.

In the BGA package 5, a signal outputted from the semiconductor chip 3 is transmitted to the circuit pattern 8 through the wire 4. The signal from the circuit pattern 8 is transmitted to the printed circuit board 1 through the solder balls 10, and then the signal is transmitted to peripheral chips (not shown). On the other hand, in the case where signals are transmitted from the peripheral chips to the semiconductor chip 3, the signals are transmitted in the reverse order.

As shown in FIG. 3, the solder balls 10 are provided on the lower surface of the substrate 7 in areas other than the center area, at regular intervals, and each solder ball 10 has the same size with respect to each other.

On the printed circuit board 51 are provided a plurality of lands 65 at positions corresponding to the solder balls 10 to mount the BGA package 5. The lands 65 have uniform sizes corresponding to the size of the solder balls 10.

Further, on the printed circuit board 51 are provided traces 70, namely, wiring patterns in order to electrically connect the BGA package or CSP (Chip Scale Package) with the peripheral chips mounted on the printed circuit board 51. However, it is hard to connect the traces 70 with the lands 65 positioned at the inside area of the printed circuit board 51 because the widths between the lands 65 are so narrow that plural traces 70 cannot easily pass therethrough. Accordingly, in the case of a multi-layered printed circuit board 51, there has been proposed a method of making via-holes in the lands 65 of the printed circuit board 51, thereby connecting the traces 70 with the inside lands 65 through the via-holes.

However, because the printed circuit board 51 should have the via-holes, and then the wiring pattern of the layer formed with the via-holes should be connected to the wiring pattern of the layer mounted with the BGA package 5 or the CSP, the design of the printed circuit board 51 becomes complicated. Moreover, if the via-holes are not satisfactory for accommodating the traces 70, a space between the lands 65 can be secured by decreasing the size of each land 65, so as to accommodate the traces 70 in the spaces. However, in this case, there is a problem that a soldering state between the solder ball 10 and the land 65 is poor because the amount of the solder connecting the land 65 with the solder ball 10 is decreased.

Thus, in the case of the printed circuit board 51 mounted with a plurality of BGA packages or CSP, it is necessary to secure a predetermined space between the lands 65. However, this lowers the level of integration of the peripheral chips on the printed circuit board 51.

SUMMARY OF THE INVENTION

Accordingly, it is an object of the present invention to provide a printed circuit board which can allow a simple design, improve the amount of integration of peripheral chips, and keep a fine soldering state.

Additional objects and advantages of the invention will be set forth in part in the description which follows and, in part, will be obvious from the description, or may be learned by practice of the invention.

These and other objects of the present invention may be accomplished by the provision of a printed circuit board (PCB) having a plurality of lands corresponding to a plurality of solder pins provided on a semiconductor chip package, the lands provided adjacent to the border of the printed circuit board and having a rectangular shape elongated in a direction toward the border.

An embodiment of the present invention provides that the lands provided adjacent to the center area of the printed circuit board have a circular shape.

An embodiment of the present invention further provides that the area of the rectangular land is substantially equal to that of the circular land.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
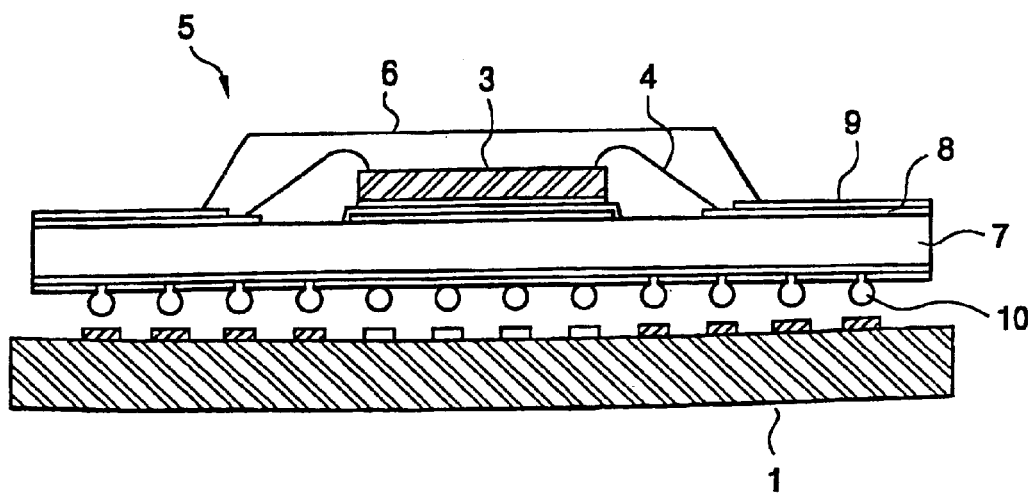
FIG. 1 is a schematic sectional view of a chip having plural pins.

Reference will now be made in detail to the embodiments of the present invention, examples of which are illustrated in the accompanying drawings, wherein like reference numerals refer to the like elements throughout. The embodiments are described below in order to explain the present invention by referring to the figures.

As illustrated in FIG. 1, a BGA (ball grid array) package, as an example of semiconductor chip packages to be mounted on a printed circuit board according to the present invention comprises a substrate 7 made of an epoxy, a circuit pattern 8 formed on the substrate 7, a solder mask 9 coated on the circuit pattern 8, a semiconductor chip 3 mounted on the center of the substrate 7, and a wire 4 electrically connecting the substrate 7 with the semiconductor chip 3. The semiconductor chip 3 and the wire 4 are covered with a resin cover 6 to prevent oxidation and corrosion thereof.

On a lower surface of the substrate 7 facing the printed circuit board 1 (see FIG. 2) is provided a plurality of solder balls 10 as solder pins which are electrically connected to the substrate 7. The solder balls 10 are provided on the lower surface of the substrate 7 at locations other than the center area and at predetermined intervals to form a plurality of rows and columns. Herein, each solder ball 10 is of a spherical shape and has the same size with respect to each other.

Figure 2:
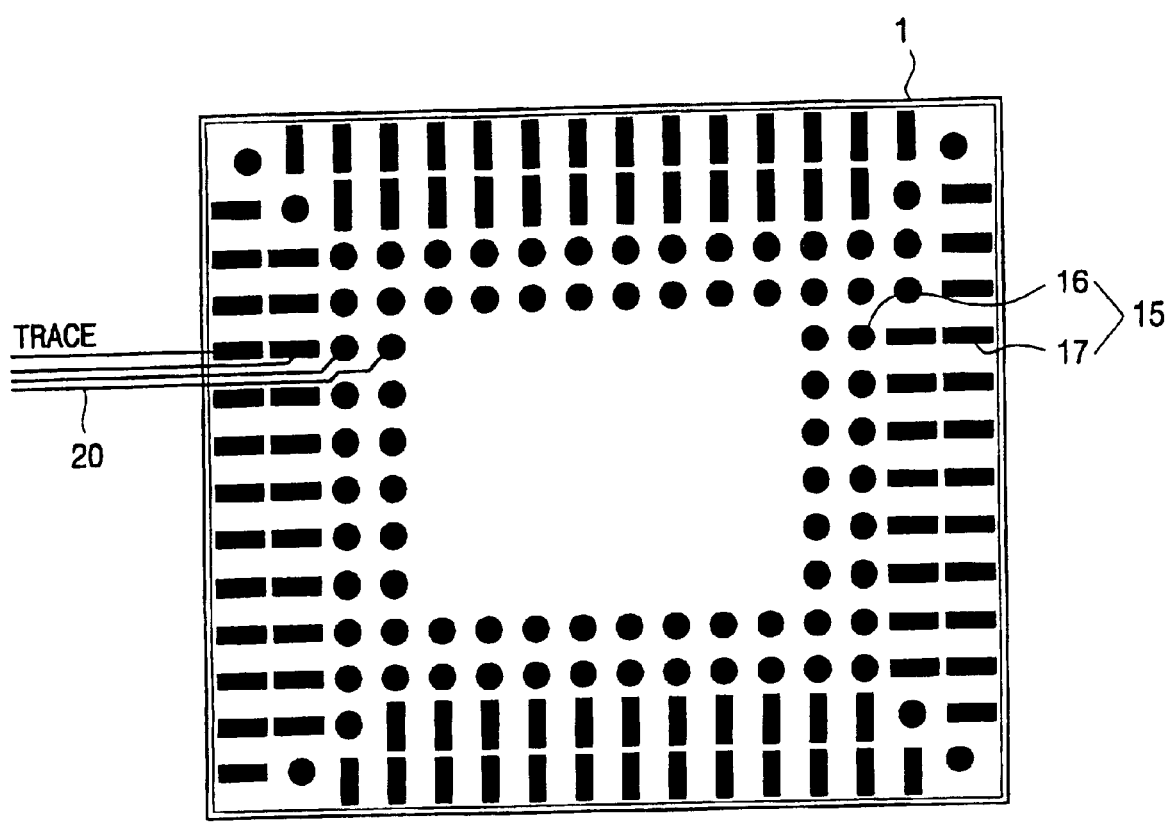
FIG. 2 is a plan view of a printed circuit board according to an embodiment of the present invention.
Figure 3:
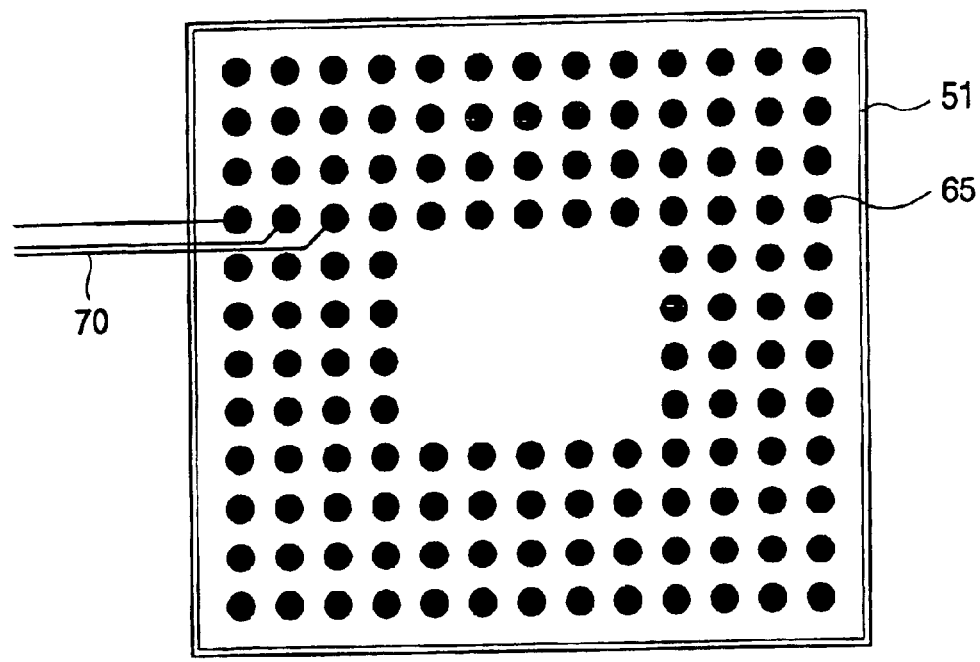
FIG. 3 is a plan view of a conventional printed circuit board.

As illustrated in FIG. 2, on the printed circuit board 1 is provided a plurality of lands 15 to mount the BGA package 5 and corresponding to the position of the solder balls 10. Like the solder balls 10, the lands 15 are arranged on the printed circuit board 1 at locations other than the center area at predetermined intervals to form a plurality rows and columns.

Among the lands 15, lands 16 adjacent to the center area of the printed circuit board 1 have circular shapes similar to the conventional lands 65, whereas lands 17 adjacent to the border of the printed circuit board 1 have rectangular shapes. The rectangular lands 17 are elongated from the center area of the printed circuit board 1 toward the border thereof, and are preferably equal in total area to the circular lands 16, respectively. Thus, the width between the rectangular lands 17 is wider than the width between the circular lands 16.

Accordingly, since the widths between the lands 17 are increased at the border area of the printed circuit board 1, enough space is secured between the rectangular lands 17 to accommodate traces 20 therein. Herein the traces 20 connect the printed circuit board 1 with peripheral chips by being connected to the respective lands 15. Furthermore, as the rectangular lands 17 are equal to the circular lands 16 in area, a soldering state of the solder ball 10 at each rectangular land 17 is equivalent to a soldering state thereof at each circular land 16.

On the other hand, at corner areas where the respective rows of the rectangular lands 17 meet, the circular lands 16 can be provided because of a sufficient space to accommodate the traces 20.

As described above, according to the present invention, in the printed circuit board 1 mounted with the BGA package or the CSP having plural pins such as the solder balls 10, the lands 16 adjacent to the center area thereof have the circular shape like the conventional lands 65, whereas the lands 17 adjacent to the border thereof have the rectangular shape. Accordingly, the space to accommodate the traces 20 to be connected to the lands 16 adjacent to the center thereof can be secured, without forming via-holes, thereby accomplishing a simple design for the printed circuit board 1 and improving the integration of the peripheral chips on the printed circuit board 1.

In the above-described embodiment, the lands 16 adjacent to the center area of the printed circuit board 1 have circular shapes, but it may have rectangular shapes like the land 17 adjacent to the border thereof, or other shapes that provide the function obtained by the present invention.

As described above, according to the present invention, a printed circuit board is provided, which can achieve a simple design, improve the integration of peripheral chips mounted thereon, and secure a fine soldering state.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A printed circuit board having a plurality of lands corresponding to a plurality of solder pins provided on a semiconductor chip package, the plurality of said lands comprises rectangular lands which are provided adjacent to a border of said printed circuit board and having a rectangular shape elongated in a direction toward the border, and circular lands which are provieded adjacent to a center are of said printed circuit board and having a circular shape, wherein each of said lands is individually connected to a respective trace and a total area of each of the rectangular lands is equal to a total area of the circular lands, respectively.

2. The printed circuit board according to claim 1, wherein said semiconductor chip package is a BGA package.

3. The printed circuit board according to claim 1, wherein widths between said rectangular lands are greater than the widths between said circular lands.

4. A printed circuit board comprising:

a plurality of lands provided at predetermined intervals along a surface of the printed circuit board, wherein said lands located in a center region of said printed circuit board have a circular shape and said lands located adjacent to a border of said printed circuit board have a rectangular shape elongated in a direction toward the border thereof and each of said lands is individually connected to a respective trace, and a total area of each of said lands having the rectangular shape is equal to a total area of each of said lands having the cirular shape, respectively.

5. A printed circuit board electrically connected to a semiconductor chip package having a plurality of solder pins of substantially the same size, the printed circuit board comprising:

a plurality of lands corresponding to positions of the solder pins, ones of said lands being positioned at a border of the printed circuit board and having a rectangular shape elongated in a direction toward the border, and ones of said lands being positioned adjacent to a center area of the printed circuit board and having circular shape, wherein each of the lands is individually connected to a respective trace and a total area of each ones of said lands having the retangular shape is equal to a total area of each ones of said lands having the circular shape, respectively.

6. The printed circuit board according to claim 5, wherein said rectangular lands surround the circular lands on the printed circuit board.

7. The printed circuit board according to claim 5, wherein said rectangular lands are formed in lines along multiple sides of the border, and ones of said lands where the lines meet at corners of the border have a circular shape.

8. The printed circuit board according to claim 5, further comprising traces extending from each of said circular lands between adjacent ones of said rectangular lands to the border of the printed circuit board.

9. The printed circuit board according to claim 5, wherein said rectangular lands are formed in multiple lines parallel to each of multiple sides of the border.

10. The printed circuit board according to claim 5, wherein widths between said rectangular lands are greater than the widths between said circular lands.

11. The printed circuit board according to claim 5, wherein widths between said rectangular lands are greater than the widths between said circular lands.

12. An apparatus comprising:
  a semiconductor chip package comprising:
    a substrate having a plurality of solder pins of substantially the same size provided on a first surface thereof,
    a circuit pattern provided on a second surface of said substrate opposite the first surface,
    a semiconductor chip provided on the second surface,
    a wire connecting the semiconductor chip to said circuit pattern; and
  a printed circuit board comprising:
    a plurality of lands corresponding to positions of the solder pins, ones of said lands being positioned at a border of the printed circuit board and having a rectangular shape elongated in a direction toward the border and ones of said lands adjacent to a center of the printed cirucit board having a circular shape, wherein each of the lands is individually connected to a respective trace and a total area of each of the rectangular lands is equal to a total area of each of the ciruclar lands, respectively.

* * * * *

UNITED STATES PATENT AND TRADEMARK OFFICE
CERTIFICATE OF CORRECTION

PATENT NO. : 7,199,478 B2  Page 1 of 1
APPLICATION NO. : 10/156016
DATED : April 3, 2007
INVENTOR(S) : Sung-Ho Jung It is certified that error appears in the above-identified patent and that said Letters Patent is hereby corrected as shown below:

Column 4, Line 22, change "provieded" to --provided--.

Column 4, Line 45, change "cirular" to --circular--.

Column 4, Line 55, after "having" insert --a--.

Column 4, Line 58, change "retangular" to --rectangular--.

Column 6, Line 12, After "printed" change "cirucit" to --circuit--.

Column 6, Line 16, change "ciruclar" to --circular--.

Signed and Sealed this

Seventeenth Day of July, 2007

JON W. DUDAS
*Director of the United States Patent and Trademark Office*